(12) United States Patent
Park et al.

(10) Patent No.: US 8,148,767 B2
(45) Date of Patent: Apr. 3, 2012

(54) SEMICONDUCTOR MEMORY DEVICES INCLUDING RECESS-TYPE CONTROL GATE ELECTRODES AND METHODS OF FABRICATING THE SEMICONDUCTOR MEMORY DEVICES

(75) Inventors: Yoon-dong Park, Yongin-si (KR);
June-mo Koo, Yongin-si (KR);
Kyoung-lae Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 374 days.

(21) Appl. No.: 11/709,860

(22) Filed: Feb. 23, 2007

(65) Prior Publication Data
US 2007/0272973 A1    Nov. 29, 2007

(30) Foreign Application Priority Data
May 26, 2006 (KR) .................. 10-2006-0047528

(51) Int. Cl.
*H01L 29/788* (2006.01)

(52) U.S. Cl. ........ 257/315; 257/316; 257/330; 257/318; 438/257; 438/259; 438/264

(58) Field of Classification Search .................. 257/315, 257/316, 330; 438/257, 259, 264, 270
See application file for complete search history.

(56) References Cited

U.S. PATENT DOCUMENTS

| | | | |
|---|---|---|---|
| 5,045,490 A * | 9/1991 | Esquivel et al. | 438/259 |
| 5,567,635 A | 10/1996 | Acovic et al. | |
| 5,874,760 A * | 2/1999 | Burns et al. | 257/315 |
| 6,025,626 A * | 2/2000 | Tempel | 257/315 |
| 6,630,708 B1 | 10/2003 | Uchiyama | |
| 6,720,611 B2 * | 4/2004 | Jang | 257/315 |

(Continued)

FOREIGN PATENT DOCUMENTS

EP       0 485 018 A2      5/1992

(Continued)

OTHER PUBLICATIONS

Notice of a Search Report issued by the European Patent Office on Aug. 7, 2009, for corresponding Application No. 06125067.6-2203.

(Continued)

*Primary Examiner* — Steven Loke
*Assistant Examiner* — David Goodwin
(74) *Attorney, Agent, or Firm* — Harness, Dickey & Pierce, P.L.C.

(57) ABSTRACT

A semiconductor memory device includes a semiconductor substrate, a control gate electrode recessed in the semiconductor substrate, a storage node layer interposed between a sidewall of the control gate electrode and the semiconductor substrate, a tunneling insulation layer interposed between the storage node layer and the semiconductor substrate, a blocking insulation layer interposed between the storage node layer and the control gate electrode, and first and second channel regions formed around a surface of the semiconductor substrate to at least partially surround the control gate electrode. The semiconductor memory device may include a plurality of control gate electrodes, storage node layers, tunneling insulation layers, blocking insulation layers, and continuous first and second channel regions. A method of fabricating the semiconductor memory device includes etching the semiconductor substrate to form a plurality of holes, forming the tunneling insulation layers, storage node layers, blocking insulation layers, and control gate electrodes.

30 Claims, 10 Drawing Sheets
(1 of 10 Drawing Sheet(s) Filed in Color)

U.S. PATENT DOCUMENTS

| | | | |
|---|---|---|---|
| 2002/0195668 A1* | 12/2002 | Endoh et al. | 257/390 |
| 2005/0051830 A1 | 3/2005 | Smith | |
| 2005/0130373 A1* | 6/2005 | Choi | 438/257 |
| 2005/0133851 A1* | 6/2005 | Forbes | 257/315 |
| 2005/0287762 A1 | 12/2005 | Lee et al. | |
| 2006/0157753 A1* | 7/2006 | Kim et al. | 257/288 |
| 2006/0170031 A1* | 8/2006 | Kang et al. | 257/315 |
| 2007/0004134 A1* | 1/2007 | Vora | 438/257 |
| 2007/0007581 A1* | 1/2007 | Chen et al. | 257/315 |
| 2008/0023749 A1* | 1/2008 | Kim et al. | 257/316 |
| 2008/0277711 A1* | 11/2008 | Sommer | 257/315 |

FOREIGN PATENT DOCUMENTS

| | | |
|---|---|---|
| GB | 2380857 A | 4/2003 |
| WO | WO 2005/112119 A1 | 11/2005 |

OTHER PUBLICATIONS

Office Action for U.S. Appl. No. 11/808,982, mailed on Feb. 3, 2009.
Office Action for U.S. Appl. No. 11/808,982, mailed on Jul. 2, 2009.
Notice of a Search Report issued by the European Patent Office on Oct. 15, 2009, for corresponding Application No. 06125067.6-2203.

* cited by examiner

SEMICONDUCTOR MEMORY DEVICES INCLUDING RECESS-TYPE CONTROL GATE ELECTRODES AND METHODS OF FABRICATING THE SEMICONDUCTOR MEMORY DEVICES

PRIORITY STATEMENT

This application claims priority from Korean Patent Application No. 10-2006-0047528, filed on May 26, 2006, in the Korean Intellectual Property Office (KIPO), the entire contents of which are incorporated herein by reference.

BACKGROUND

1. Field

Example embodiments relate to semiconductor memory devices and methods of fabricating the semiconductor memory devices. Also, example embodiments relate to semiconductor memory devices including recess-type control gate electrodes and methods of fabricating the semiconductor memory devices including the recess-type control gate electrodes.

2. Description of Related Art

In line with the current trend of reducing the size and increasing the operating speed of semiconductor products, semiconductor memory devices used for the semiconductor products may be further integrated to attain high operating speeds. Accordingly, semiconductor memory devices including a three dimensional structure instead of a related art planar-type structure have been introduced. The semiconductor memory devices including the three dimensional structure may include recess-type control gate electrodes that extend inside a semiconductor substrate.

The semiconductor memory devices including the three-dimensional structure may have channel areas wider than semiconductor memory devices including a planar-type structure, and thus have faster operating speeds. However, in the semiconductor memory devices including the three-dimensional structure, a unit cell is operated by unit bits while occupying a large area.

Therefore, the further increase in integration of the three-dimensional semiconductor memory devices is limited. Moreover, source regions and drain regions still occupy wide areas in the semiconductor memory devices including the three dimensional structure. Particularly, the source regions and the drain regions may be alternately disposed to occupy larger areas even in "not and" (NAND) semiconductor memory devices that may be suitable for integration, which thus limits the increase in integration.

SUMMARY

Example embodiments may provide semiconductor memory devices suitable for high operating speeds and increased integration.

Example embodiments also may provide an economic method of fabricating the semiconductor memory devices.

According to example embodiments, semiconductor memory devices may include a semiconductor substrate. A control gate electrode may be recessed inside the semiconductor substrate and/or a storage node layer may be interposed between a sidewall of the control gate electrode and the semiconductor substrate. A tunneling insulation layer may be disposed between the storage node layer and the semiconductor substrate, and/or a blocking insulation layer may be formed between the storage node layer and the control gate electrode. First and second channel regions may be formed around a surface of the semiconductor substrate under the tunneling insulation layer to surround the control gate electrode, and/or may be separated by a pair of separating insulation layers.

In this case, the control gate electrode may have, for example, a cylindrical or substantially cylindrical shape, an elliptical or substantially elliptical shape, or a polygonal or substantially polygonal shape. Also, the storage node layer, the tunneling insulation layer, and/or the blocking insulation layer may be formed near and/or along the sidewall of the control gate electrode.

The semiconductor memory device may further include a buried insulation layer interposed between a bottom of the control gate electrode and the semiconductor substrate that may be thicker than the tunneling insulation layer.

According to example embodiments, semiconductor memory devices may include a semiconductor substrate. A plurality of control gate electrodes may be respectively recessed inside the semiconductor substrate, and a plurality of storage node layers may each be interposed between the sidewalls of the control gate electrodes and the semiconductor substrate. A plurality of tunneling insulation layers may each be interposed between the storage node layers and the semiconductor substrate, and adjacent pairs of the plurality of tunneling insulation layers may contact each other to separate the semiconductor substrate into first and second regions. A plurality of blocking insulation layers may each be interposed between the storage node layers and the control gate electrodes. Also, a continuous first channel region may surround portions of sidewalls of the control gate electrodes, around the surface of the first region of the semiconductor substrate. A continuous second channel region may surround other portions of the sidewalls of the control gate electrodes around the surface of the second region of the semiconductor substrate.

According to example embodiments, methods of fabricating semiconductor memory devices may include etching a semiconductor substrate to form a plurality of holes. A plurality of tunneling insulation layers may be formed on semiconductor substrate portions of sidewalls of the holes by making adjacent pairs of the tunneling insulation layers contact each other to separate the semiconductor substrate into first and second regions. After forming a plurality of storage node layers on the tunneling insulation layers, blocking insulation layers may be formed on the storage node layers. Also, control gate electrodes may be formed on the blocking insulation layers to be filled into the holes and recessed inside the semiconductor substrate.

In this case, the methods may further include annealing the semiconductor substrate having the holes using hydrogen vapors.

BRIEF DESCRIPTION OF THE DRAWINGS

The patent or application file contains at least one drawing executed in color. Copies of this patent or patent application publication with color drawing will be provided by the Office upon request and payment of the necessary fee.

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
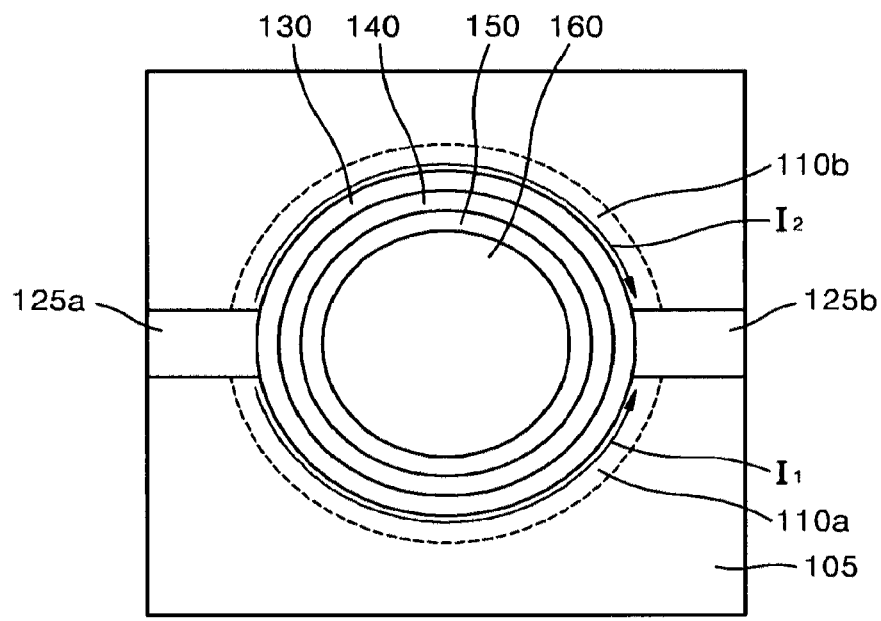
FIG. 1 is a plan view illustrating a semiconductor memory device according to an example embodiment.

Example embodiments will now be described more fully with reference to the accompanying drawings. Embodiments may, however, be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to," or "coupled to" another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, such as "beneath," "below," "lower," "above," "upper," and the like may be used herein for ease of description to describe one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to the like components throughout.

Structure

Semiconductor memory devices according to example embodiments may include three-dimensional structure. For example, in a semiconductor memory device, a control gate electrode may extend inside a semiconductor substrate. The control gate electrode may be a "recess type" or a "trench type" control gate electrode. Of course, the control gate electrode may not be a "recess type" or "trench type" control gate electrode The semiconductor memory devices according to example embodiments may be nonvolatile memory devices (i.e., one or more flash memories and/or one or more silicon oxide nitride oxide silicon (SONOS) memories.

Figure 2:
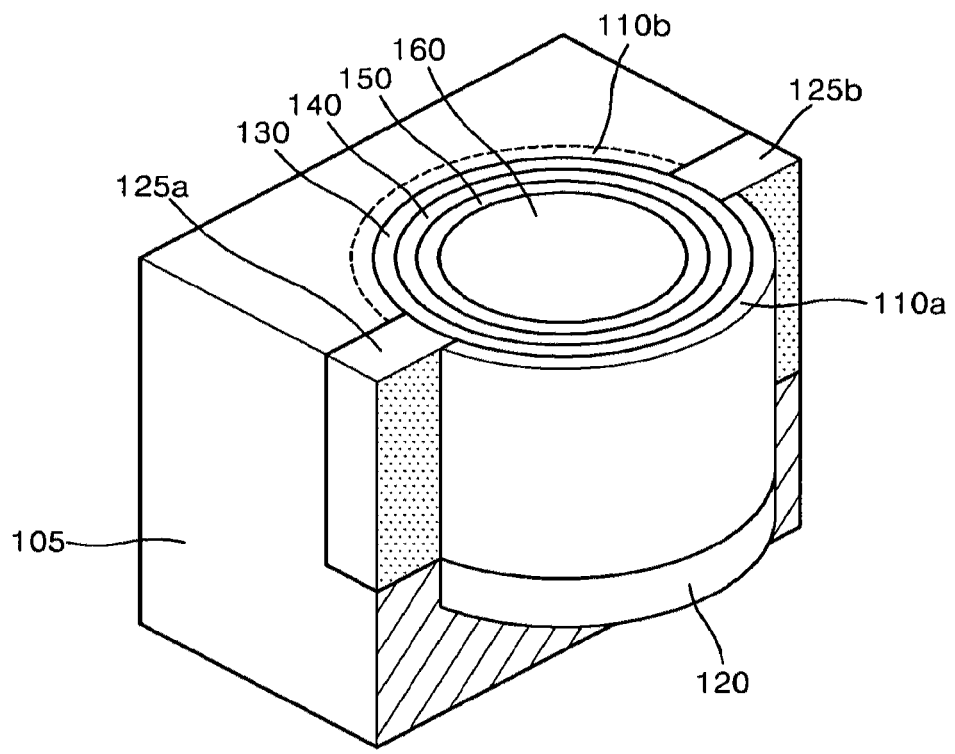
FIG. 2 is a partially cutaway perspective view illustrating the semiconductor memory device according to the example embodiment of FIG. 1.

FIG. 1 is a plan view illustrating a semiconductor memory device according to an example embodiment. FIG. 2 is a partially cutaway perspective view illustrating the semiconductor memory device according to the example embodiment of FIG. 1.

Referring to FIGS. 1 and 2, the semiconductor memory device may be formed using a semiconductor substrate 105, and may include first channel region 110a, second channel region 110b, tunneling insulation layer 130, storage node layer 140, blocking insulation layer 150, and control gate electrode 160. The semiconductor memory device commonly controls the first channel region 110a and second channel region 110b using the control gate electrode 160. However, the first channel region 110a and the second channel region 110b may be separated from each other by first separating insulation layer 125a and second separating insulation layer 125b. Selectively, the semiconductor memory device may further include a buried insulation layer 120.

Example embodiments of the semiconductor substrate 105 may include bulk semiconductor wafer (i.e., a silicon wafer, a germanium wafer, and/or a silicon-germanium wafer. In addition or in the alternative, the semiconductor substrate 105 may include a semiconductor epitaxial layer on a bulk semiconductor wafer.

The control gate electrode 160 may be recessed inside the semiconductor substrate 105. The control gate electrode 160 may be, for example, cylindrically shaped or substantially cylindrically shaped and, therefore, may induce a radial electric field. The control gate electrode 160 may be shaped symmetrically or substantially symmetrically about a line that connects the first separating insulation layer 125a and the second separating insulation layer 125b. However, the control gate electrode 160 also may have, for example, an elliptical bar shape or a substantially elliptical bar shape.

The storage node layer 140 may be interposed between a sidewall of the control gate electrode 160 and the semiconductor substrate 105. The storage node layer 140 may be used as a charge storage medium. For example, the storage node layer 140 may include a polysilicon layer, a silicon nitride layer, metal and/or silicon dots, and/or metal or silicon nano-crystal(s). The silicon nitride layer, metal and/or silicon dots, and/or metal and/or silicon nano-crystal(s) may be used, for example, as a local charge trap layer.

The tunneling insulation layer 130 may be interposed between the storage node layer 140 and the semiconductor substrate 105. The tunneling insulation layer 130 may be used as a tunneling path for charges, and may have a proper thickness according to an operating voltage. For example, the tunneling insulation layer 130 may include an oxide layer, a nitride layer, and/or a layer with a high dielectric constant K. The blocking insulation layer 150 may isolate the storage node layer 140 from the control gate electrode 160 by being interposed between them. For example, the blocking insulation layer 150 may include an oxide layer, a nitride layer, and/or a layer with a high dielectric constant K.

The tunneling insulation layer 130, the storage node layer 140, and/or the blocking insulation layer 150 may be formed near and/or along a sidewall of the control gate electrode 160. That is, the blocking insulation layer 150 may surround the control gate electrode 160, the storage node layer 140 may surround the blocking insulation layer 150, and/or the tunneling insulation layer 130 may surround the storage node layer 140. Accordingly, the tunneling insulation layer 130, the storage node layer 140, and/or the blocking insulation layer 150 may have, for example, a hollowed cylindrical shape.

The first channel region 110a and the second channel region 110b may be formed around a surface of the semiconductor substrate 105 under the tunneling insulation layer 130 so as to surround the sidewall of the control gate electrode 160. The first channel region 110a and the second channel region 110b may be separated by the first separating insulation layer 125a and the second separating insulation layer 125b. The first separating insulation layer 125a may face, for example, the second separating insulation layer 125b. For example, the first channel region 110a may be disposed under the first separating insulation layer 125a and the second separating insulation layer 125b, and the second channel region 110b may be disposed over the first separating insulation layer 125a and the second separating insulation layer 125b. For example, the first separating insulation layer 125a and the second separating insulation layer 125b may be connected to the tunneling insulation layer 130, and may include an oxide layer, a nitride layer, and/or a layer with a high dielectric constant K.

The buried insulation layer 120 may be interposed between a bottom of the control gate electrode 160 and the semiconductor substrate 105. The buried insulation layer 120 may be thicker than the tunneling insulation layer 130 so as not to form a channel in the bottom area of the semiconductor substrate 105. Thus, the first channel region 110a and the second channel region 110b may not be connected even in the bottom area of the semiconductor substrate 105.

The semiconductor memory device may use, for example, the first channel region 110a and the second channel region 110b as separate bit lines, and the control gate electrode 160 as a common word line. In this case, four corner portions of the first channel region 110a and the second channel region 110b may be used, for example, as input/output (I/O) ports. That is, the flow of a first current I1 may be permitted through the first channel region 110a, and the flow of a second current I2 may be permitted through the second channel region 110b.

Figure 19:
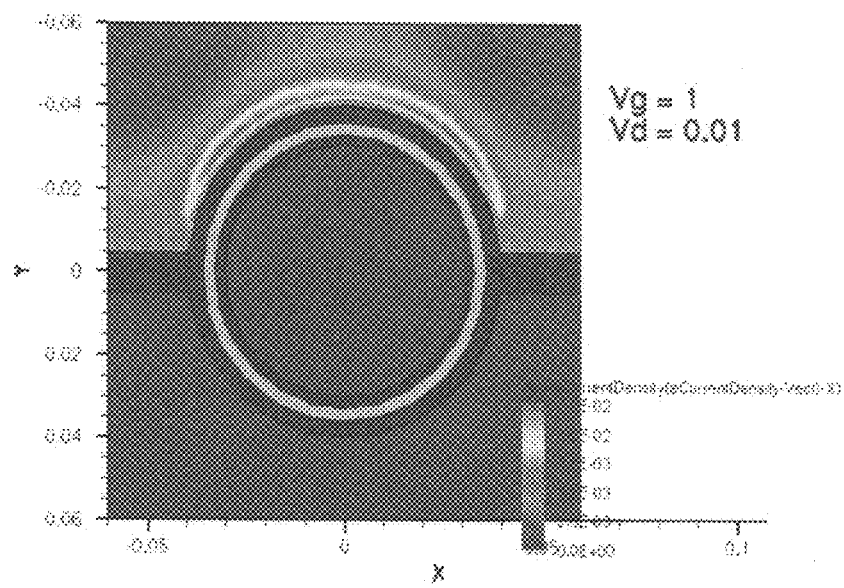
FIG. 19 illustrates simulation results of current density distribution in the semiconductor memory device of FIG. 1.

A simulation performed with respect to the current density illustrated in FIG. 19 supports the result of the foregoing operation. In FIG. 19, a color-tone distribution displays a distribution of the current density. Also, the control gate electrode 160 of FIG. 1 may be supplied with a voltage of 1 V (Vg=1), and both ends of the second channel region 110b of FIG. 1 may be supplied with a voltage of 0.01 V (Vd=0.01). Referring to FIG. 19, it can be noted that a high current density region may be formed similarly to the first channel region 110a and the second channel region 110b of FIGS. 1 and 2. The result of the simulation shows that the flow of the first current I1 may be induced in the first channel region 110a and the flow of the second current I2 may be induced in the second channel region 110b.

Meanwhile, the storage node layer 140 may be ring-shaped, for example, but portions facing the first channel region 110a and the second channel region 110b may be local charge storage layers. Therefore, the semiconductor memory device may process 2 bits data even in a single-level operation. Furthermore, the first channel region 110a and the second channel region 110b may have larger areas by adjusting the vertical depth, which in turn may increase the operating speed of the semiconductor memory device.

Figure 3:
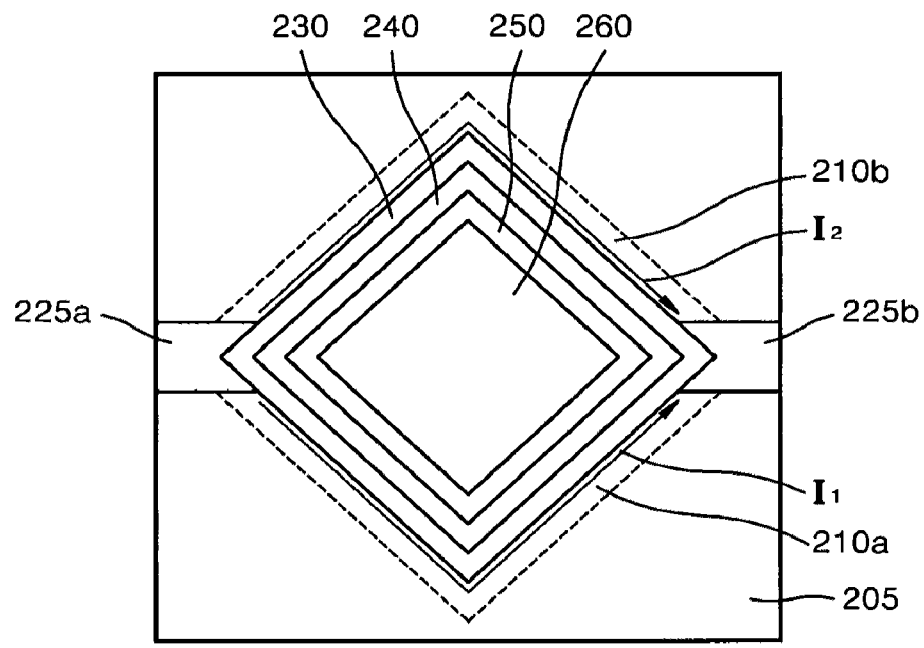
FIG. 3 is a plan view illustrating a semiconductor memory device according to another example embodiment.
Figure 4:
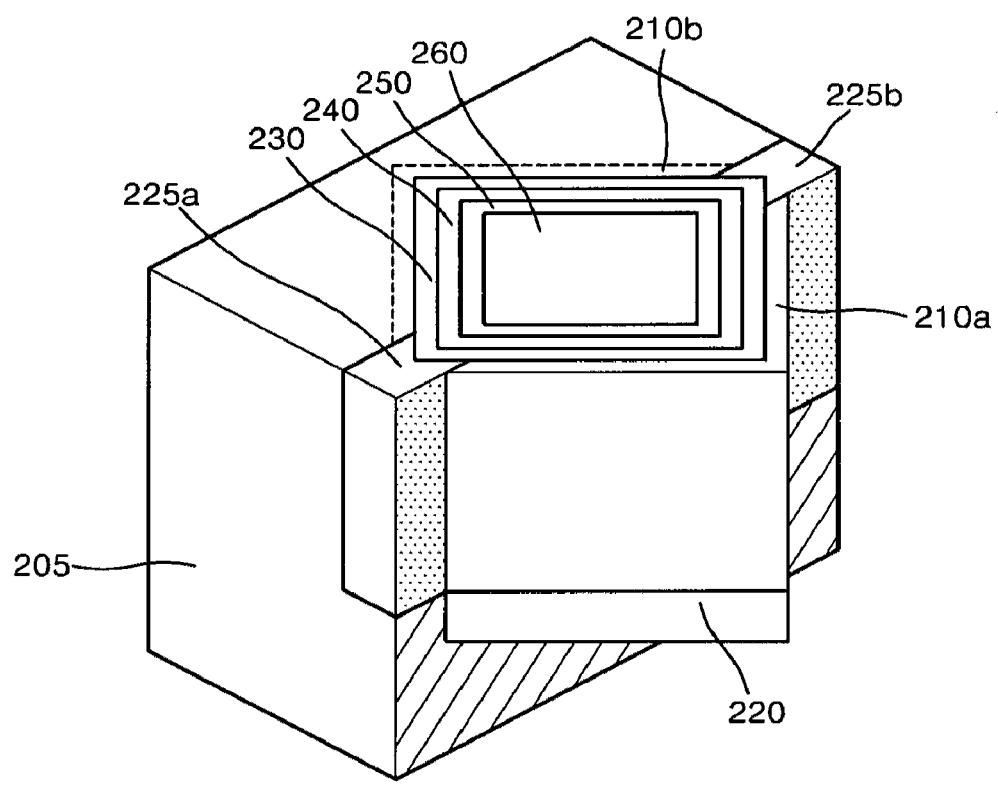
FIG. 4 is a partially cutaway perspective view illustrating the semiconductor memory device according to the example embodiment of FIG. 3.

FIG. 3 is a plan view illustrating a semiconductor memory device according to another example embodiment. FIG. 4 is a partially cutaway perspective view illustrating the semiconductor memory device according to the example embodiment of FIG. 3. The semiconductor memory device illustrated in FIGS. 3 and 4 may have, for example, a different shape from that illustrated in FIGS. 1 and 2. Descriptions of similar elements will not be repeated.

Referring to FIGS. 3 and 4, control gate electrode 260 may have a rectangular bar shape or a substantially rectangular bar shape and may be recessed inside a semiconductor substrate 205. However, the control gate electrode 260 may have, for example, one or more other polygonal or substantially polygonal shapes. A blocking insulation layer 250, a storage node layer 240, and/or a tunneling insulation layer 230 may be formed near and/or along the rectangular bar-shaped control gate electrode 260.

First channel region 210a and second channel region 210b may surround the rectangular bar-shaped control gate electrode 260 and may be separated from each other by first separating insulation layer 225a and second separating insulation layer 225b. For example, the first separating insulation layer 225a and the second separating insulation layer 225b may be adjacent to facing corners of the rectangular bar-shaped control gate electrode 260. A bottom of the control gate electrode 260 may be isolated from the semiconductor substrate 205 using a buried insulation layer 220. The buried insulation layer 220 may be thinner than, the same thickness as, or thicker than the tunneling insulation layer 230.

Figure 5:
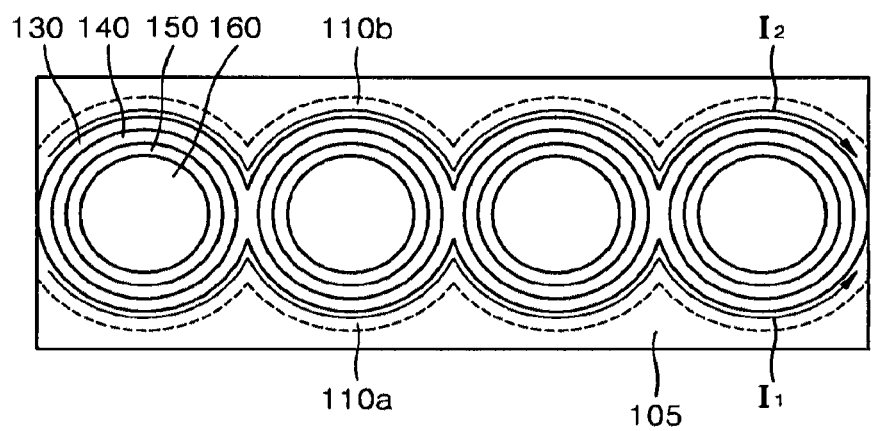
FIG. 5 is a plan view illustrating a semiconductor memory device according to yet another example embodiment.
Figure 6:
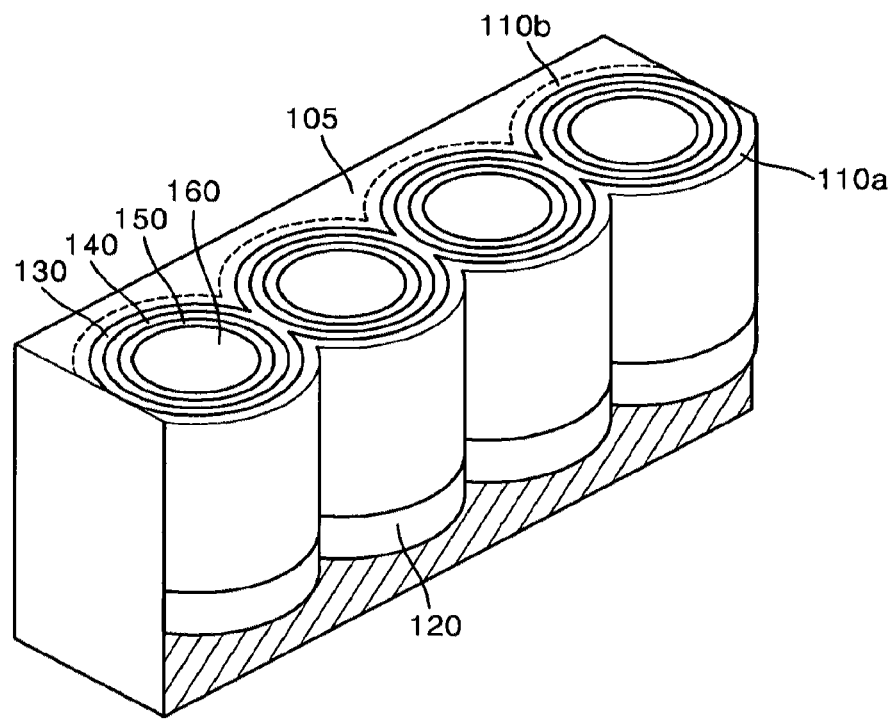
FIG. 6 is a partially cutaway perspective view illustrating the semiconductor memory device according to the example embodiment of FIG. 5.

FIG. 5 is a plan view illustrating a semiconductor memory device according to yet another embodiment. FIG. 6 is a partially cutaway perspective view illustrating the semiconductor memory device according to the example embodiment of FIG. 5. The semiconductor memory device according to the example embodiment illustrated in FIGS. 5 and 6 may employ the semiconductor memory device illustrated in FIGS. 1 and 2 as a unit cell, and a plurality of such unit cells may be NAND-type connected. The same reference numerals in FIGS. 1 and 2 denote similar elements and, thus, their descriptions will not be repeated.

Referring to FIGS. 5 and 6, a plurality of control gate electrodes 160, a plurality of blocking insulation layers 150, and/or a plurality of storage node layers 140 may be separately formed in a plurality of unit cells. However, the tunneling insulation layers 130 may be formed so that adjacent pairs contact each other. That is, end portions of the tunneling insulation layers 130 of the unit cells may be connected to one another, thereby forming a continuous shape. Accordingly, the semiconductor substrate 105 may be separated into an upper region over the tunneling insulation layers 130 and a lower region under the tunneling insulation layers 130.

Even though the tunneling insulation layers 130 of the adjacent unit cells may contact each other directly or may be overlapped in FIGS. 5 and 6, the first separating insulation layer 125a and the second separating insulation layer 125b may be interposed as illustrated in FIGS. 1 and 2. Otherwise, it may be understood that the contacting portions of the tunneling insulation layers 130 of adjacent unit cells may correspond to the first separating insulation layer 125a and the second separating insulation layer 125b of FIGS. 1 and 2.

Since the end portions of the tunneling insulation layers 130 of the unit cells may be connected to each other, the first channel regions 110a of the unit cells in the lower region of the semiconductor substrate 105 may be connected to each other. Similarly, the second channel regions 110b of the unit cells in the upper region of the semiconductor substrate 105 may be connected to each other. Consequently, the first channel regions 110a of the unit cells may be connected to each other without separately requiring source regions and drain regions, and may allow the flow of the first current I1. Similarly, the second channel regions 110b of the unit cells may be connected to each other without separately requiring source regions and drain regions, and may allow the flow of the second current I2.

Figure 20:
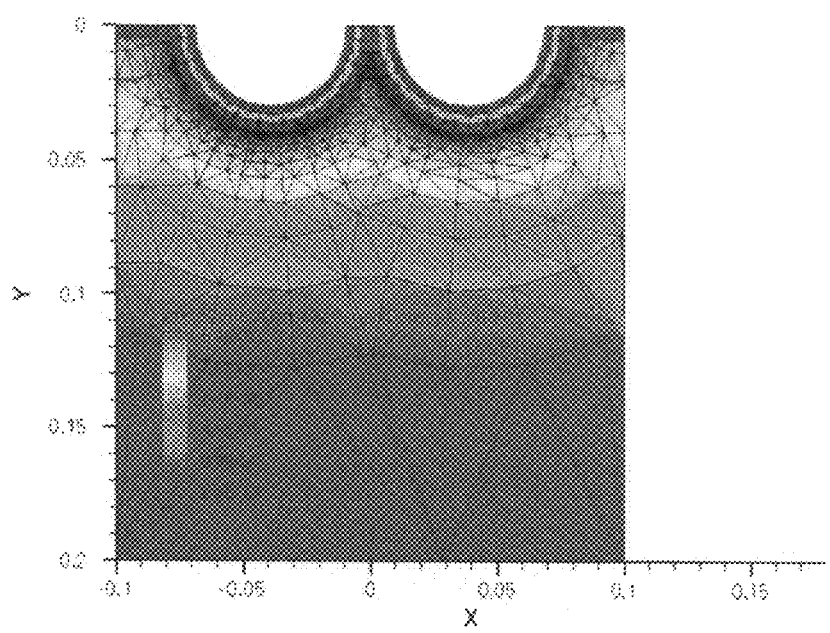
FIG. 20 illustrates simulation results of current density distribution in the semiconductor memory device of FIG. 5.

Because the control gate electrodes 160 may develop a radial electric field, the first channel regions 110a and the second channel regions 110b of the unit cells may be mutually connected without requiring the source regions and drain regions. Simulation results with respect to the current density as illustrated in FIG. 20 supports this idea. Referring to FIG. 20, a high current density region similarly shaped to the first channel regions 110a and the second channel regions 110b of FIGS. 5 and 6 may be formed within the semiconductor substrate 105. Therefore, by using the radial electric field, the continuing first channel regions 110a and the continuing second channel regions 110b may be formed without the source regions and the drain regions.

Although four unit cells are illustrated in FIGS. 5 and 6, the semiconductor memory devices may have, for example, two unit cells, three unit cells, five unit cells, and/or more unit cells. Accordingly, the semiconductor memory device may be, for example, a single NAND-type string, and the number of the unit cells within a single string may be appropriately selected.

The semiconductor memory devices according to the example embodiments may have a NAND structure with no source region and/or no drain region, so that an occupied area may be greatly decreased as compared with the related art NAND structure. Thus, the semiconductor memory device may have significantly higher integration. Moreover, the semiconductor memory devices may process two-bit data even in the case of a single-level operation, thereby making it possible to achieve higher operating speeds.

Figure 7:
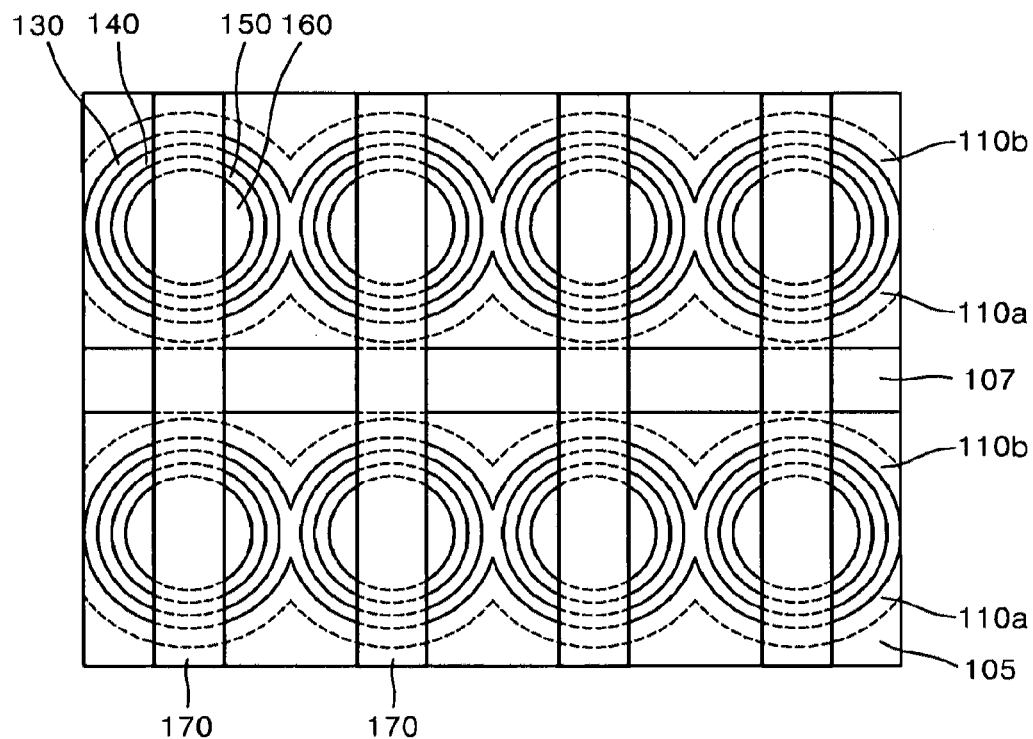
FIG. 7 is a plan view illustrating a semiconductor memory device according to a further example embodiment.

FIG. 7 is a plan view illustrating a semiconductor memory device according to a further example embodiment. The embodiment illustrated in FIG. 7 may use the semiconductor memory device illustrated in FIG. 5 as one string, and two such strings may be arranged as an array. The same reference numerals in FIGS. 5 and 7 denote similar elements and, thus, their descriptions will not be repeated.

Referring to FIG. 7, two strings may be electrically insulated by a device isolation layer 107. Two pairs of first channel regions 110a and second channel regions 110b may be used as four-bit lines. In two strings, control gate electrodes 160 of the same column may be connected to a word line 170. Accordingly, by adequately selecting the word lines 170 and the bit lines, respective unit cells may be operated.

Although two strings are illustrated in FIG. 7, the semiconductor memory devices may have, for example, three strings, four strings, and/or more strings. Furthermore, the number of the unit cells within respective strings may be selected as desired. Any string may have fewer unit cells than, the same number of unit cells as, or more unit cells than any other string or strings.

Figure 8:
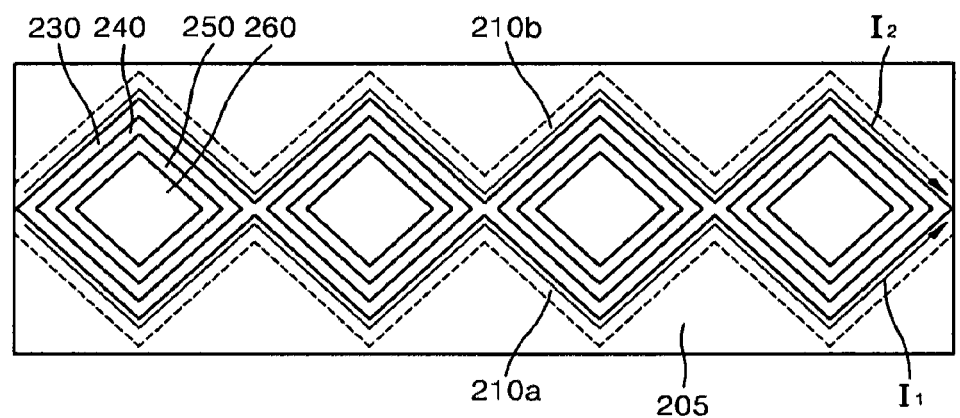
FIG. 8 is a plan view illustrating a semiconductor memory device according to yet a further example embodiment.
Figure 9:
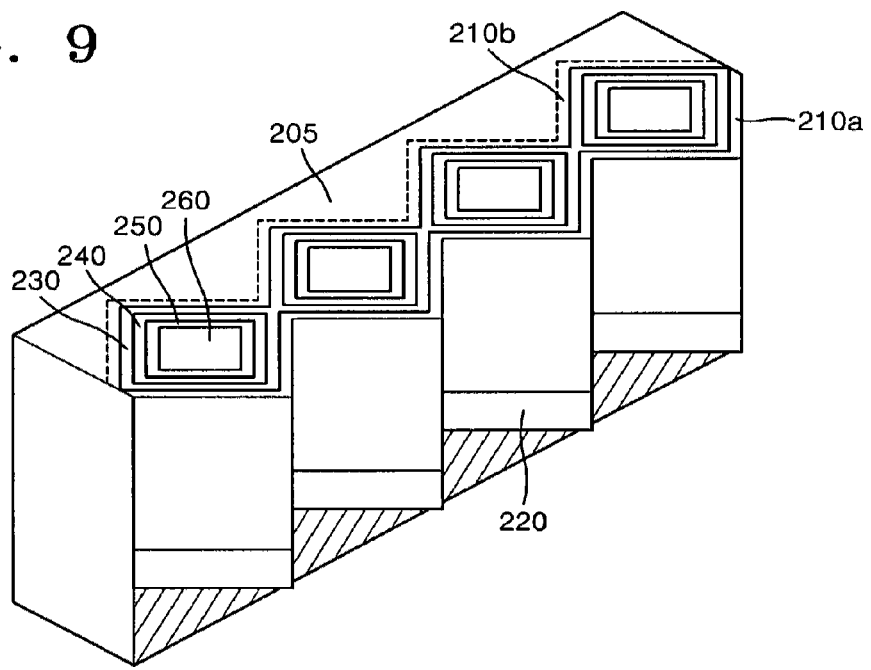
FIG. 9 is a partially cutaway perspective view illustrating the semiconductor memory device according to the example embodiment of FIG. 8.

FIG. 8 is a plan view illustrating a semiconductor memory device according to yet a further example embodiment. FIG. 9 is a partially cutaway perspective view illustrating the semiconductor memory device according to the example embodiment of FIG. 8. The semiconductor memory device according to the example embodiment of FIGS. 8 and 9 may use the semiconductor memory device according to the example embodiment illustrated in FIGS. 3 and 4 as a unit cell, and a plurality of such unit cells may be NAND-type connected. The same reference numerals in FIGS. 3, 4, 8, and 9 denote similar elements and, thus, their descriptions will not be repeated.

Referring to FIGS. 8 and 9, a plurality of control gate electrodes 260, a plurality of blocking insulation layers 250, and/or a plurality of storage node layers 240 may be separately formed in a plurality of unit cells. However, a plurality of tunneling insulation layers 230 may be formed so that adjacent pairs contact each other. That is, the tunneling insulation layers 230 of the unit cells may be connected via respective corners, thereby making a single continuous form. Thus, the semiconductor substrate 205 may be separated into an upper region over the tunneling insulation layers 230 and a lower region under the tunneling insulation layers 230.

Even though the tunneling insulation layers 230 of the adjacent unit cells may directly contact each other or may be overlapped in FIGS. 8 and 9, first separating insulation layer 225a and second separating insulation layer 225b may be interposed as illustrated in FIGS. 3 and 4. Otherwise, it may be understood that the contacting portions of the tunneling insulation layers 230 of the adjacent unit cells may correspond to the first separating insulation layer 225a and the second separating insulation layer 225b of FIGS. 3 and 4.

Since the corners of the tunneling insulation layers 230 of the unit cells may be connected to each other, first channel regions 210a of the unit cells in the lower region of the semiconductor substrate 205 may be connected to each other. Similarly, second channel regions 210b of the unit cells in the upper region of the semiconductor substrate 205 may be connected to each other. Consequently, the first channel regions 210a of the unit cells may be connected to each other without separately requiring source regions and drain regions, and may allow the flow of the first current I1. Similarly, the second channel regions 210b of the unit cells may be connected to each other with no source regions and/or no drain regions, and may allow the flow of the second current I2.

Although four unit cells are illustrated in FIGS. 8 and 9, the semiconductor memory devices may have, for example, two unit cells, three unit cells, five unit cells, and/or more unit cells. Therefore, the semiconductor memory device may be, for example, a single NAND-type string, and the number of the unit cells within a single string may be appropriately selected.

Operation of the semiconductor memory device according to the example embodiment may be understood from FIGS. 5 and 6.

Figure 10:
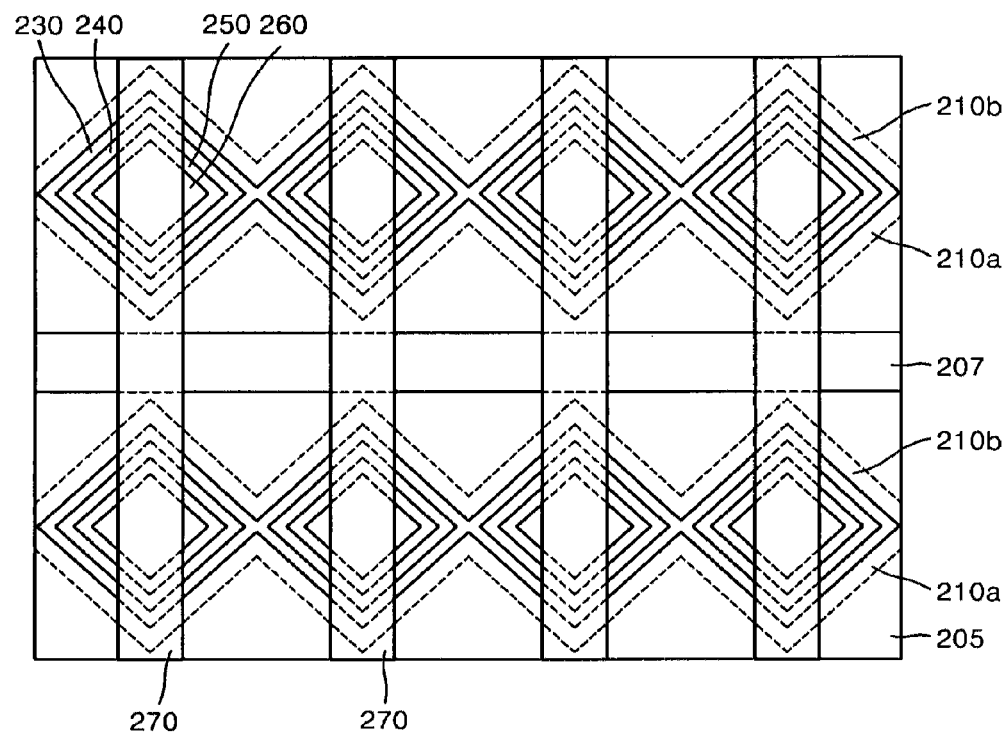
FIG. 10 is a plan view illustrating a semiconductor memory device according to another further example embodiment.

FIG. 10 is a plan view illustrating a semiconductor memory device according to another further example embodiment. The example embodiment illustrates two strings that may be arranged as an array when using the semiconductor memory device illustrated in FIG. 8 as a single string. The same reference numerals in FIGS. 8 and 10 denote similar elements and, thus, their descriptions will not be repeated.

Referring to FIG. 10, two strings may be electrically isolated by device isolation layer 207. Two pairs of channel regions 210a and 210b may be used as four-bit lines. In the two strings, control gate electrodes 260 of the same column may be connected to a word line 270. Accordingly, by adequately selecting the word lines 270 and the bit lines, respective unit cells may be operated.

Although two strings are illustrated in FIG. 10, the semiconductor memory devices may have, for example, three strings, four strings, and/or more strings. Furthermore, the number of the unit cells within respective strings may be selected as desired. Any string may have fewer unit cells than, the same number of unit cells as, or more unit cells than any other string or strings.

Fabrication Method

FIGS. 11 through 18 are plan views and sectional views for illustrating methods of fabricating the semiconductor memory devices according to example embodiments. The semiconductor memory devices may correspond, for example, to that illustrated in FIGS. 5 and 6.

Figure 11:
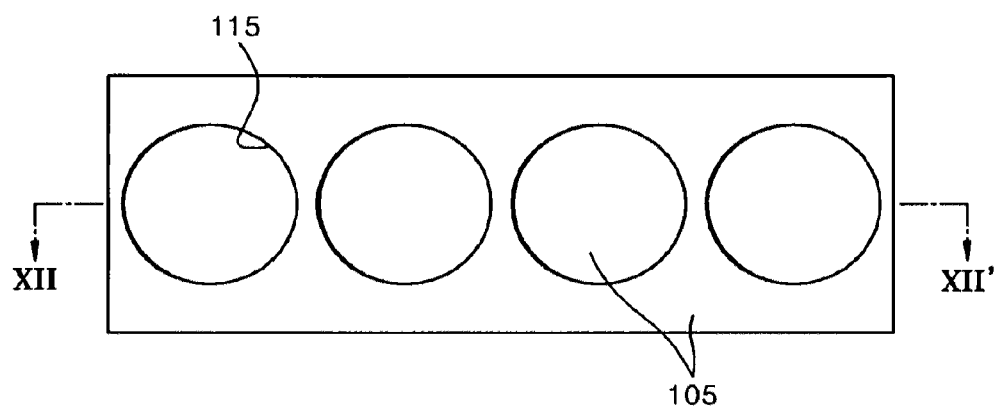
FIGS. 11 through 18 are plan views and sectional views for illustrating methods of fabricating semiconductor memory devices according to example embodiments.
Figure 12:
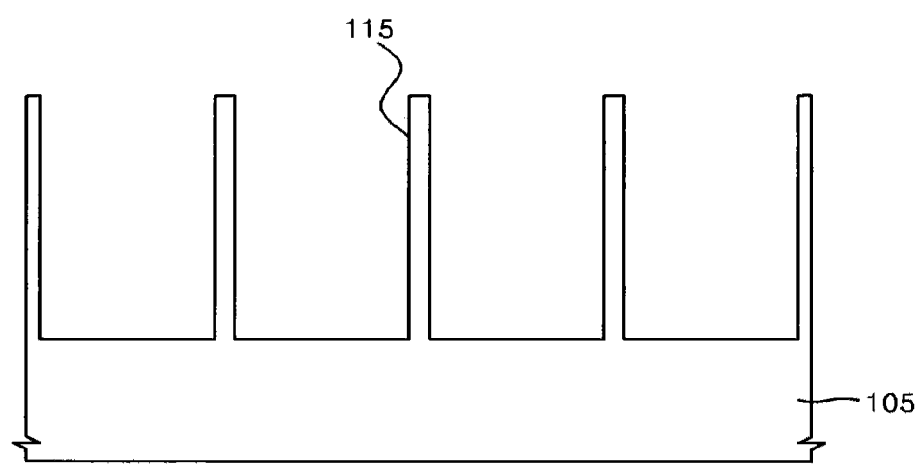

Referring to FIGS. 11 and 12, a semiconductor substrate 105 may be etched to form a plurality of holes 115. The holes 115 may be formed by, for example, photolithography and/or etching. Although the holes 115 may be circularly shaped or substantially circularly shaped in FIGS. 11 and 12, they may have another shape. For example, the holes 115 may have an elliptical and/or substantially elliptical shape, and/or the holes 115 may have a polygonal and/or substantially polygonal shape. Holes 115 may or may not be symmetrical. Holes 115 may have more than one shape. Holes 115 may be, for example, tapered up or down.

The holes 115 may be enlarged and rounded, for example, by annealing the semiconductor substrate 105 in a hydrogen atmosphere after etching. The annealing may be performed at high temperature to generate silicon diffusion of the semiconductor substrate 105 (i.e., a silicon wafer), thereby rounding the holes 115.

Figure 13:
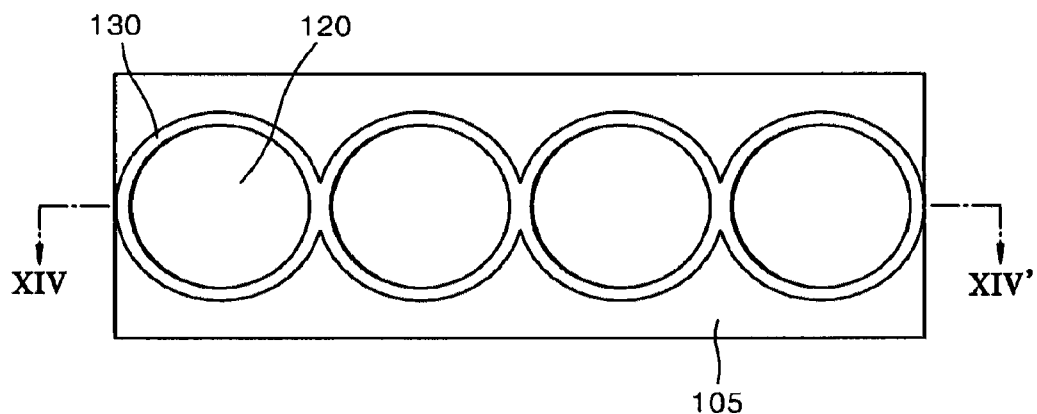
Figure 14:
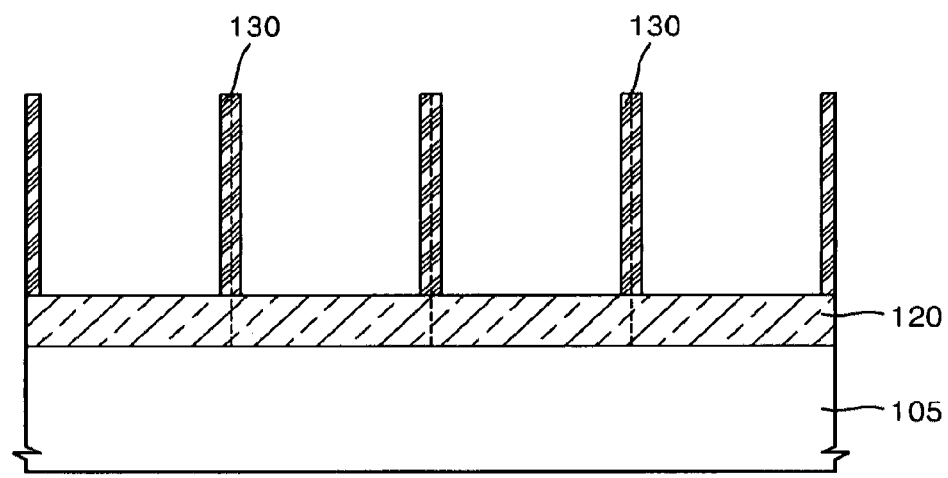

Referring to FIGS. 13 and 14, a plurality of tunneling insulation layers 130 may be formed on portions of the semiconductor substrate 105 of the sidewalls of the holes 115 so that adjacent pairs of the tunneling insulation layers 130 may contact each other. Thus, the semiconductor substrate 105 may be separated into an upper region over the tunneling insulation layers 130 and a lower region under the tunneling insulation layers 130. For example, the tunneling insulation layers 130 may be formed by thermally oxidizing the sidewall portions of the semiconductor substrate 105 exposed by the holes 115. In this case, one or more portions of the semiconductor substrate on boundary portions of adjacent holes 115 may be oxidized, thereby connecting the tunneling insulation layers 130 to each other.

Before or after forming the tunneling insulation layers 130, a buried insulation layer 120 may be selectively formed on the semiconductor substrate 105 portion of the holes 115. For example, the buried insulation layer 120 may be formed using chemical vapor deposition (CVD) and/or etching.

Figure 15:
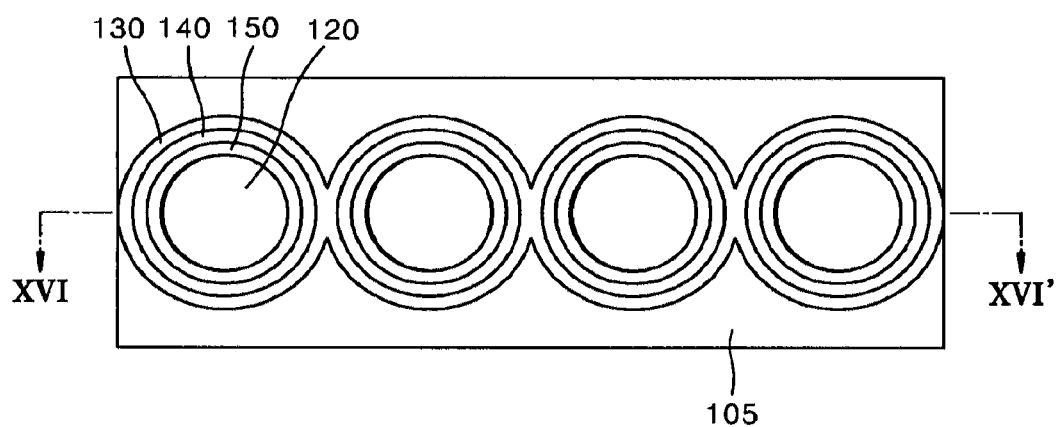
Figure 16:
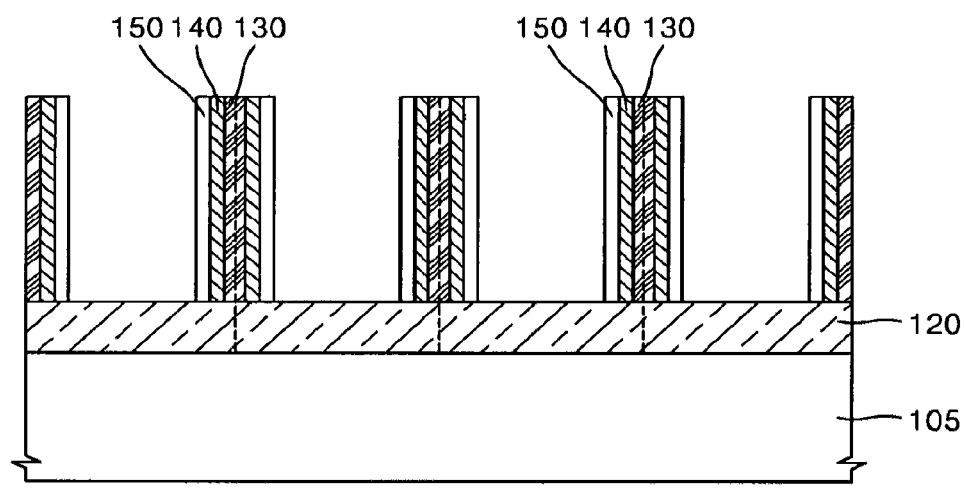

Referring to FIGS. 15 and 16, a plurality of storage node layers 140 may be formed on the tunneling insulation layers 130. For example, a polysilicon layer, a silicon nitride layer, metal and/or silicon dots, and/or metal and/or silicon nanocrystal(s) may be formed using CVD, and predetermined portions may be selectively removed, thereby forming the storage node layers 140.

Then, blocking insulation layers 150 may be formed on the storage node layers 140. For example, an oxide layer, a nitride layer, and/or a layer with a high dielectric constant K may be formed using CVD, and predetermined portions may be selectively removed, thereby forming the blocking insulation layers 150.

Figure 17:
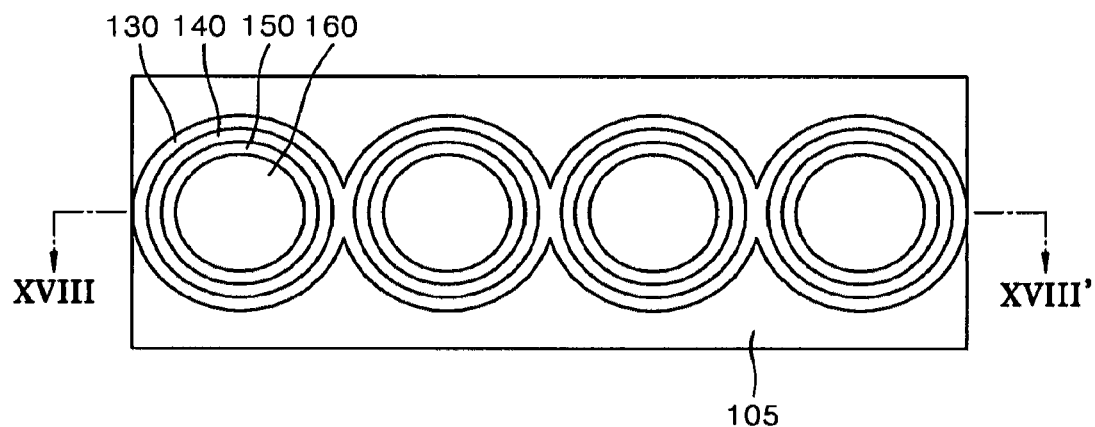
Figure 18:
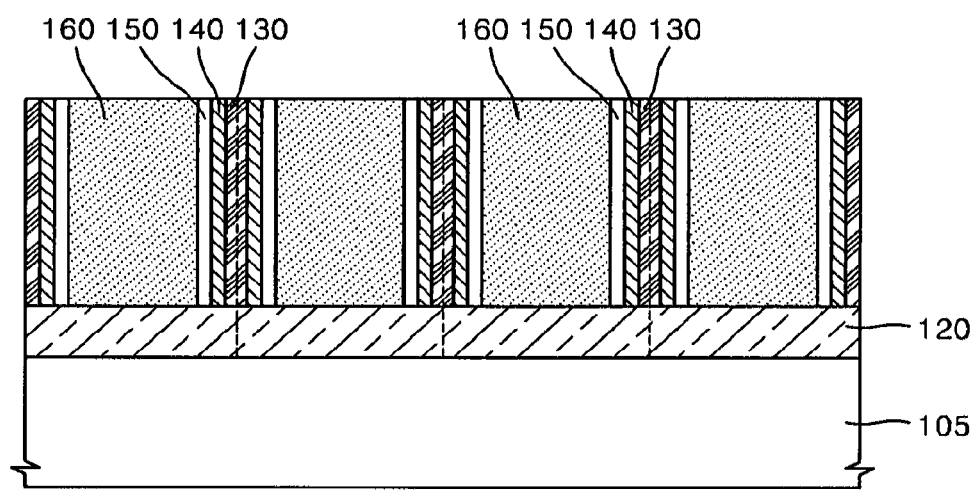

Referring to FIGS. 17 and 18, control gate electrodes 160 may be formed on the blocking insulation layers 150 to be filled into the holes 115 and may be recessed inside the semiconductor substrate 105. For example, after a conductive layer may be filled into the holes 115 and then planarized, the control gate electrodes 160 may be formed.

Thereafter, the semiconductor memory devices may be completed according to methods known to one of ordinary skill in the art. In the example embodiments, the semiconductor memory devices may be economically manufactured using a typical bulk semiconductor wafer.

Although the methods of fabricating the semiconductor memory devices illustrated in FIGS. 5 and 6 are described as example embodiments, one of ordinary skill in the art may modify and apply the methods to fabricate other semiconductor memory devices.

While example embodiments have been particularly shown and described, it will be understood by one of ordinary skill in the art that various changes in form and details may be made therein without departing from the spirit and scope of the present invention as defined by the following claims.

What is claimed is:

1. A semiconductor memory device, comprising:
   a semiconductor substrate including at least one hole;
   a control gate electrode recessed in the semiconductor substrate to fill the at least one hole;
   a storage node layer interposed between a sidewall of the control gate electrode and a sidewall portion of the semiconductor substrate exposed from the at least one hole;
   a tunneling insulation layer laterally disposed between the storage node layer and the sidewall portion of the semiconductor substrate;
   a blocking insulation layer interposed between the storage node layer and the control gate electrode; and
   first and second channel regions formed around the sidewall portion of the semiconductor substrate;
   wherein the first and second channel regions are separated from each other via separating insulation layers, and
   wherein the control gate electrode is formed symmetrically about a line connecting the separating insulation layers.

2. The semiconductor memory device of claim 1, wherein the control gate electrode has a substantially cylindrical, substantially elliptical, or substantially polygonal shape.

3. The semiconductor memory device of claim 1, wherein the control gate electrode has a cylindrical, elliptical, or polygonal shape.

4. The semiconductor memory device of claim 1, wherein the storage node layer, the tunneling insulation layer, and the blocking insulation layer are formed to surround the sidewall of the control gate electrode.

5. The semiconductor memory device of claim 1, wherein one or more of the storage node layer, the tunneling insulation layer, and the blocking insulation layer are formed along the sidewall of the control gate electrode.

6. The semiconductor memory device of claim 1, further comprising:
a buried insulation layer interposed between a bottom of the control gate electrode and the semiconductor substrate.

7. The semiconductor memory device of claim 6, wherein the buried insulation layer is thicker than the tunneling insulation layer.

8. The semiconductor memory device of claim 1, wherein the storage node layer comprises one or more of a polysilicon layer, a silicon nitride layer, metal dots, silicon dots, metal nano-crystals, and silicon nano-crystals.

9. The semiconductor memory device of claim 1, wherein the separating insulation layers are portions of the tunneling insulation layer.

10. The semiconductor memory device of claim 1, wherein the first and second channel regions are commonly controlled by the control gate electrode.

11. A semiconductor memory device, comprising: a semiconductor substrate including three or more holes;
a plurality of control gate electrodes recessed in the semiconductor substrate to fill the plurality of holes;
a plurality of storage node layers interposed between sidewalls of the control gate electrodes and sidewall portions of the semiconductor substrate exposed from the plurality of holes;
a plurality of tunneling insulation layers interposed between the storage node layers and the sidewalls portions of the semiconductor substrate;
a plurality of blocking insulation layers interposed between the storage node layers and the control gate electrodes;
a continuous first channel region formed around a first region of the sidewall portions of the semiconductor substrate; and
a continuous second channel region formed around a second region of the sidewall portions of the semiconductor substrate;
wherein adjacent pairs of the tunneling insulation layers contact each other, forming a line of two or more contact regions, to
separate the sidewall portions of the semiconductor substrate into the first and second channel regions,
and each of the plurality of control gate electrodes is formed symmetrically about a line connecting the tunneling insulation layers along points of the two or more contact regions.

12. The semiconductor memory device of claim 11, wherein one or more of the control gate electrodes has a substantially cylindrical, substantially elliptical, or substantially polygonal shape.

13. The semiconductor memory device of claim 11, wherein one or more of the control gate electrodes has a cylindrical, elliptical, or polygonal shape.

14. The semiconductor memory device of claim 11, wherein the storage node layers, the tunneling insulation layers, and the blocking insulation layers are formed to surround the sidewalls of the control gate electrodes.

15. The semiconductor memory device of claim 11, wherein one or more of the storage node layers, the tunneling insulation layers, and the blocking insulation layers are formed along the sidewalls of the control gate electrodes.

16. The semiconductor memory device of claim 11, wherein one or more of the control gate electrodes is substantially polygonal bar-shaped, and
wherein corners of adjacent pairs of the tunneling insulation layers contact each other.

17. The semiconductor memory device of claim 11, wherein the first channel region is symmetrically formed, and
wherein the second channel region is symmetrically formed.

18. The semiconductor memory device of claim 11, wherein the first channel region is symmetrically formed with respect to the second channel region.

19. The semiconductor memory device of claim 11, further comprising:
a plurality of buried insulation layers interposed between bottoms of the control gate electrodes and the semiconductor substrate.

20. The semiconductor memory device of claim 19, wherein at least one of the buried insulation layers is thicker than at least one of the tunneling insulation layers.

21. The semiconductor memory device of claim 11, wherein one or more of the storage node layers comprises one or more polysilicon layers, silicon nitride layers, metal dots, silicon dots, metal nano-crystals, or silicon nano-crystals.

22. The semiconductor memory device of claim 11, wherein the first channel region and the second channel region are used as separate bit lines.

23. A semiconductor memory device, comprising:
a semiconductor substrate including at least one hole;
a control gate electrode recessed in the semiconductor substrate to fill the at least one hole;
a storage node layer interposed between a sidewall of the control gate electrode and a sidewall portion of the semiconductor substrate exposed from the at least one hole;
a tunneling insulation layer interposed between the storage node layer and the sidewall portion of the semiconductor substrate;
a blocking insulation layer interposed between the storage node layer and the control gate electrode;
a buried insulation layer interposed between a bottom of the control gate electrode and the semiconductor substrate; and
first and second channel regions formed around the sidewall portion of the semiconductor substrate;
wherein the tunneling insulation layer extends from the buried insulation layer to a surface of the semiconductor substrate,
wherein the first and second channel regions are separated from each other via separating insulation layers, and
wherein the control gate electrode is formed symmetrically about a line connecting the separating insulation layers.

24. The semiconductor memory device of claim 23, wherein the control gate electrode has a substantially cylindrical, substantially elliptical, or substantially polygonal shape.

25. The semiconductor memory device of claim 23, wherein the control gate electrode has a cylindrical, elliptical, or polygonal shape.

26. The semiconductor memory device of claim 23, wherein the storage node layer, the tunneling insulation layer, and the blocking insulation layer are formed to surround the sidewall of the control gate electrode.

27. The semiconductor memory device of claim 23, wherein one or more of the storage node layer, the tunneling insulation layer, and the blocking insulation layer are formed along the sidewall of the control gate electrode.

28. The semiconductor memory device of claim 23, wherein the first and second channel regions are separated from each other, in part, by the buried insulation layer.

29. The semiconductor memory device of claim 23, wherein the buried insulation layer is thicker than the tunneling insulation layer.

30. The semiconductor memory device of claim 23, wherein the storage node layer comprises one or more of a polysilicon layer, a silicon nitride layer, metal dots, silicon dots, metal nano-crystals, and silicon nano-crystals.

* * * * *